United States Patent
Kanbara et al.

(10) Patent No.: US 9,812,297 B2
(45) Date of Patent: Nov. 7, 2017

(54) METHOD OF AFFIXING HEAT TRANSFER SHEET

(71) Applicant: Tokyo Electron Limited, Tokyo (JP)

(72) Inventors: Keita Kanbara, Miyagi (JP); Naoyuki Satoh, Miyagi (JP); Takuya Ishikawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 346 days.

(21) Appl. No.: 14/159,535

(22) Filed: Jan. 21, 2014

(65) Prior Publication Data
US 2014/0202631 A1 Jul. 24, 2014

Related U.S. Application Data

(60) Provisional application No. 61/758,466, filed on Jan. 30, 2013.

(30) Foreign Application Priority Data

Jan. 23, 2013 (JP) .................................. 2013-010407

(51) Int. Cl.
H01J 37/32 (2006.01)
(52) U.S. Cl.
CPC ............................. *H01J 37/32642* (2013.01)

(58) Field of Classification Search
CPC .................................................. H01J 37/32642
See application file for complete search history.

(56) References Cited

U.S. PATENT DOCUMENTS

2002/0029745 A1* 3/2002 Nagaiwa ............. C23C 16/4581
118/723 E
2011/0214809 A1* 9/2011 Sugiyama ............... B32B 37/10
156/285

FOREIGN PATENT DOCUMENTS

| JP | S63-114118 | 5/1988 |
|---|---|---|
| JP | 2002-016126 | 1/2002 |
| JP | 2002-064134 | 2/2002 |
| JP | 2008-027930 | 2/2008 |
| JP | 2008-171899 | 7/2008 |

* cited by examiner

Primary Examiner — Christopher Schatz
(74) Attorney, Agent, or Firm — IPUSA, PLLC (57) ABSTRACT

A heat transfer sheet affixing method where a focus ring is pressed by a pressing part to a heat transfer sheet placed on a heat transfer sheet mounting part of a plasma processing apparatus to affix the heat transfer sheet to the focus ring. The method includes reducing a pressure to place the heat transfer sheet in a reduced-pressure atmosphere, heating the heat transfer sheet, and pressing the focus ring by the pressing part to the heat transfer sheet. The reducing, the heating, and the pressing are performed concurrently at least for a predetermined period of time.

9 Claims, 6 Drawing Sheets

METHOD OF AFFIXING HEAT TRANSFER SHEET

CROSS-REFERENCE TO RELATED APPLICATION

The present application is based upon and claims the benefit of priority of Japanese Patent Application No. 2013-010407 filed on Jan. 23, 2013, and U.S. Provisional Application No. 61/758,466 filed on Jan. 30, 2013, the entire contents of which are incorporated herein by reference.

BACKGROUND OF THE INVENTION

1. Field of the Invention

An aspect of this disclosure relates to a method of affixing a heat transfer sheet.

2. Description of the Related Art

In a semiconductor device production process, plasma processing such as etching or film deposition is performed many times on a semiconductor wafer (which is hereafter referred to as a "wafer") that is an object to be processed.

In a plasma processing apparatus for performing plasma processing, a focus ring is provided on a table on which a wafer is placed such that the wafer is surrounded by the focus ring. The focus ring causes the distribution range of plasma generated above the wafer to expand to cover not only a space above the wafer but also a space above the focus ring so that plasma processing is performed uniformly on the entire surface of the wafer.

During plasma processing, the wafer and the focus ring are exposed directly to plasma and as a result, their temperature rises. Therefore, the temperature of the table is controlled to control the temperature of the wafer as well as the temperature of the focus ring.

Here, when the efficiency of heat transfer between the table and the focus ring is low, it is difficult to control the temperature of the focus ring. For this reason, a heat transfer sheet made of, for example, silicon rubber is provided between the table and the focus ring to improve the contact between them and thereby improve the heat transfer efficiency.

When affixing the heat transfer sheet to the focus ring, air bubbles may enter between them. The entered air bubbles function as a heat insulating layer that reduces the efficiency of heat transfer between the table and the focus ring, and therefore make it difficult to control the temperature of the focus ring. To solve this problem, Japanese Laid-Open Patent Publication No. 2008-171899 discloses a technology where a vacuum is generated after the heat transfer sheet is affixed to concentrate fine air bubbles and then the pressure is returned to the atmospheric pressure to remove the concentrated air bubbles.

However, with the method of Japanese Laid-Open Patent Publication No. 2008-171899, air bubbles cannot be completely removed depending on how the heat transfer sheet is affixed and it is difficult to achieve sufficient heat transfer efficiency between the table and the focus ring.

SUMMARY OF THE INVENTION

In an aspect of this disclosure, there is provided a heat transfer sheet affixing method where a focus ring is pressed by a pressing part to a heat transfer sheet placed on a heat transfer sheet mounting part of a plasma processing apparatus to affix the heat transfer sheet to the focus ring. The method includes reducing a pressure to place the heat transfer sheet in a reduced-pressure atmosphere, heating the heat transfer sheet, and pressing the focus ring by the pressing part to the heat transfer sheet. The reducing, the heating, and the pressing are performed concurrently at least for a predetermined period of time.

BRIEF DESCRIPTION OF THE DRAWINGS

according to an embodiment.

DESCRIPTION OF THE PREFERRED EMBODIMENTS

Embodiments of the present invention are described below with reference to the accompanying drawings. In the present specification, a plasma processing apparatus for performing plasma processing such as etching or film deposition on a substrate such as a wafer is used as an example of a substrate processing apparatus, a focus ring is used as an example of a ring-shaped part placed on a table of the plasma processing apparatus, and a process of affixing a heat transfer sheet to the focus ring is described.

<Plasma Processing Apparatus>

First, a plasma processing apparatus where a heat transfer sheet is affixed according to a heat transfer sheet affixing method of the present embodiment is described with reference to FIG. 1.

Figure 1:
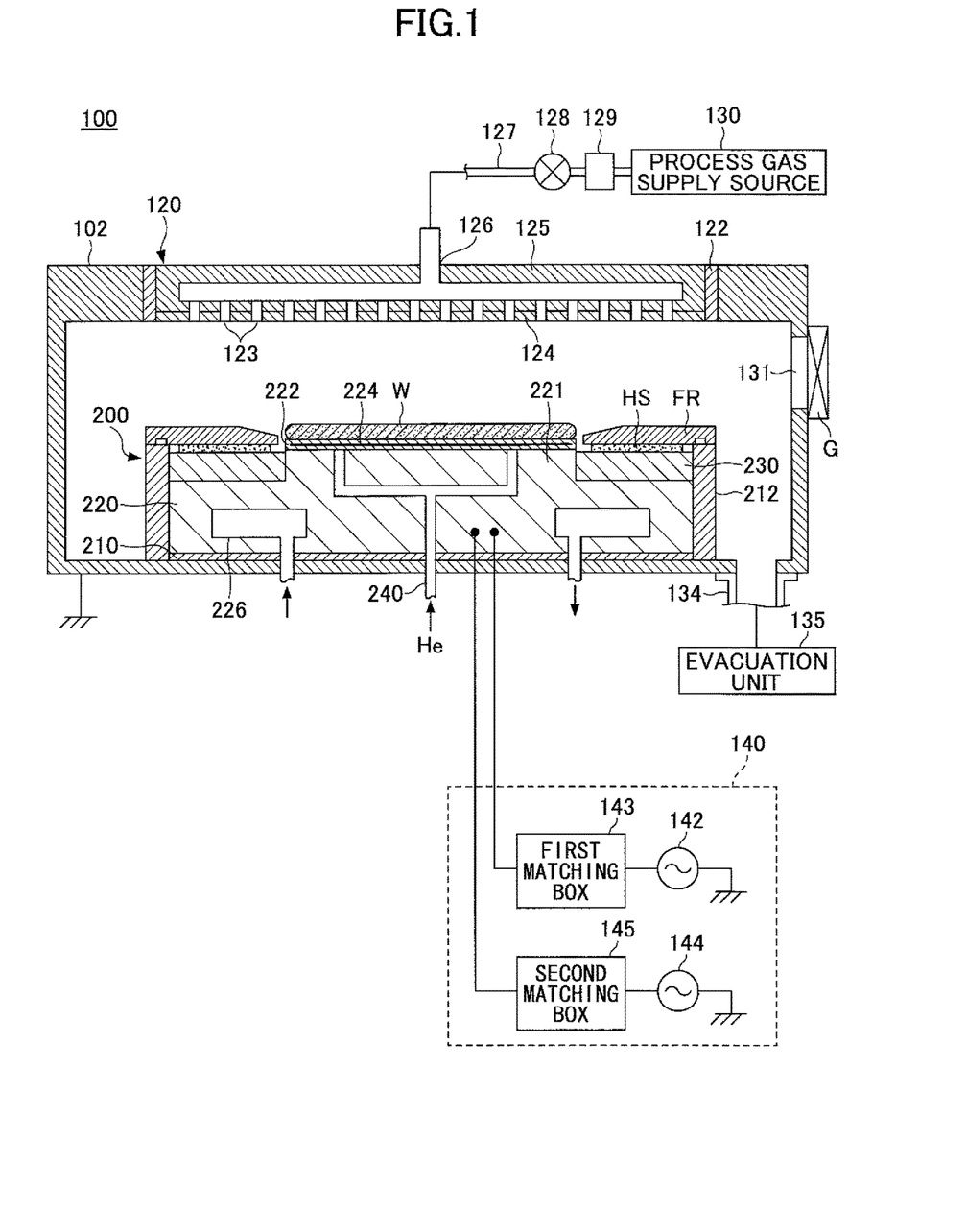
FIG. 1 is a drawing illustrating an exemplary configuration of a plasma processing apparatus for which a heat transfer sheet of an embodiment can be used.

FIG. 1 is a drawing illustrating an exemplary configuration of a plasma processing apparatus for which a heat transfer sheet of the present embodiment can be used.

A plasma processing apparatus 100 includes a chamber 102 having, for example, a cylindrical shape and used to perform plasma processing on a wafer W. The chamber 102 may be made of, for example, aluminum whose surface is anodized (or alumite treated), and is typically grounded. The plasma processing apparatus 100 may also include a controller (or a processor) for executing or controlling a heat transfer sheet affixing method of the present embodiment.

A table 200, on which the wafer W is placed, is provided on the bottom of the chamber 102. The table 200 may have, for example, a cylindrical shape. The table 200 includes an insulating plate 210 made of, for example, ceramic, and a susceptor 220 placed on the insulating plate 210 and constituting a lower electrode. The outer surface of the susceptor 220 is covered by an insulating wall 212 made of an insulator.

A temperature control medium chamber 226 is formed in the susceptor 220. A temperature control medium is introduced via an inlet pipe into the temperature control medium chamber 226. The introduced temperature control medium circulates through the temperature control medium chamber 226 and is discharged from an outlet pipe. The temperatures of the table 200, a focus ring FR described later, and the wafer W can be controlled by circulating the temperature control medium through the temperature control medium chamber 226.

An upper center part of the susceptor 220 is formed as a protrusion 221 on which the wafer W is placed. An electrostatic chuck 222 is provided on the protrusion 221. Plasma processing such as etching is performed on the wafer W that is electrostatically attracted to the electrostatic chuck 222.

The electrostatic chuck 222 includes an electrode 224 placed between insulating layers. A direct-current voltage is applied to the electrode 224 from a direct current power supply (not shown) to electrostatically attract the wafer W to the electrostatic chuck 222.

A gas channel 240 is formed in the table 200. The gas channel 240 supplies a heat transfer medium to a surface of the wafer W facing the electrostatic chuck 222. Supplying the heat transfer medium to the surface of the wafer W facing the electrostatic chuck 222 enables efficient heat transfer between the electrostatic chuck 222 and the wafer W via the heat transfer medium and makes it possible to maintain the wafer W at a predetermined temperature. For example, a helium (He) gas may be used as the heat transfer medium.

The focus ring FR is disposed on an upper peripheral part of the susceptor 220 such that the focus ring FR surrounds the wafer W. The focus ring FR is a conductive ring-shaped part made of, for example, silicon, and is provided to improve the uniformity of processing such as etching as described above.

As exemplified by FIG. 1, the focus ring FR is disposed via a heat transfer sheet HS, which is made of, for example, a silicon rubber, on a ring-shaped dielectric ring 230 surrounding the protrusion 221 of the susceptor 220. The heat transfer sheet HS has a circular ring shape and is disposed to surround the wafer W. The focus ring FR covers the heat transfer sheet HS so that the heat transfer sheet HS is not exposed to plasma during plasma processing using the plasma processing apparatus 100.

Providing the heat transfer sheet HS improves the contact between the focus ring FR and the dielectric ring 230, and improves the heat transfer efficiency between the focus ring FR, the dielectric ring 230, and the susceptor 220. In the example of FIG. 1, the dielectric ring 230 is disposed on the susceptor 220. However, the present invention is not limited to this configuration. For example, a conductive ring may be provided instead of the dielectric ring 230. Also, the dielectric ring 230 or the conductive ring may be omitted, and the focus ring FR may be placed on the heat transfer sheet HS that is placed directly on the susceptor 220. A method of affixing the heat transfer sheet HS to the dielectric ring 230, the conductive ring, or the susceptor 220 according to the present embodiment is described later.

An upper electrode 120 is provided above the susceptor 220 such that the upper electrode 120 faces and becomes parallel to the susceptor 220. The space between the susceptor 220 constituting the lower electrode and the upper electrode 120 functions as a plasma generating space. The upper electrode 120 forms a surface, i.e., a facing surface, that faces the wafer W on the susceptor 220 and is adjacent to the plasma generating space.

The upper electrode 120 is supported via an insulator 122 by an upper part of the chamber 102. The upper electrode 120 includes an electrode plate 124 and an electrode support 125. The electrode plate 124 includes a facing surface facing the susceptor 220 and has multiple discharge holes 123. The electrode support 125 detachably supports the electrode plate 124.

A power supply device 140 for supplying two-frequency superposed power is connected to the susceptor 220. The power supply device 140 includes a first high-frequency power supply 142 for supplying first high-frequency power that is used to generate plasma and has a first frequency. The power supply device 140 also includes a second high-frequency power supply 144 for supplying second high-frequency power that is used to generate a bias voltage and has a second frequency that is lower than the first frequency. Each of the first high-frequency power supply 142 and the second high-frequency power supply 144 is electrically connected to the susceptor 220 via the corresponding one of a first matching box 143 and a second matching box 145.

Each of the first matching box 143 and the second matching box 145 makes the internal (or output) impedance of the corresponding one of the first high-frequency power supply 142 and the second high-frequency power supply 144 to match a load impedance. Also, while plasma is being generated in the chamber 102, each of the first matching box 143 and the second matching box 145 makes the internal impedance of the corresponding one of the first high-frequency power supply 142 and the second high-frequency power supply 144 to apparently match the load impedance.

A gas inlet 126 is provided in the center of the electrode support 125 of the upper electrode 120. A process gas supply source 130 is connected via a gas supply pipe 127 to the gas inlet 126. The process gas supply source 130 contains, for example, an etching gas for plasma etching. A valve 128 and a mass flow controller 129 are provided on the gas supply pipe 127 to control the flow rate of the process gas.

In the example of FIG. 1, one process gas supply system including the gas supply pipe 127, the valve 128, and the mass flow controller 129, and the process gas supply source 130 is provided. However, the present invention is not limited to this configuration. In general, the plasma processing apparatus 100 may include multiple process gas supply systems, and the flow rates of process gases supplied from the process gas supply systems into the chamber 102 are controlled independently.

An evacuation pipe 134 is connected to the bottom of the chamber 102, and an evacuation unit 135 is connected to the exhaust pipe 134. The evacuation unit 135 includes a vacuum pump such as a turbo molecular pump and is capable of adjusting the pressure in the chamber 102 to a predetermined vacuum pressure (reduced-pressure atmosphere). Although the details are described later, "vacuum" in a method of affixing the heat transfer sheet HS of the present embodiment is achieved by the evacuation unit 135.

A carry-in/out port 131 for carrying the wafer W to be processed in and out of the chamber 102 and a gate valve G are provided on a side wall of the chamber 102.

A plasma etching process on the wafer W is briefly described below as an example of plasma processing performed by the plasma processing apparatus 100. First, the wafer W is carried by, for example, a conveying arm (not shown) into the chamber 102. The wafer W is placed on the table 200 and is electrostatically attracted to the electrostatic chuck 222. A process gas is introduced from the process gas supply source 130 into the chamber 102, and the chamber 102 is evacuated by the evacuation unit 135 to reduce the pressure in the chamber 102 to a predetermined value. While the pressure in the chamber 102 is maintained at a predetermined vacuum pressure, plasma generation high-frequency power and bias generation high-frequency power are applied by the first high frequency power supply 142 and the second high-frequency power supply 144 to the susceptor 220 to generate plasma of the process gas on the wafer W and thereby perform etching.

<Outline of Method of Affixing Heat Transfer Sheet>

Next, a method of affixing the heat transfer sheet HS to the focus ring FR of the plasma processing apparatus 100 is outlined. In the present embodiment, the heat transfer sheet HS is affixed, for example, when the plasma processing apparatus 100 is initially installed or maintenance of the plasma processing apparatus 100 is performed.

As described above, the heat transfer sheet HS is affixed to the lower surface of the focus ring FR. That is, the heat transfer sheet HS is affixed to the focus ring FR by placing the focus ring FR on the heat transfer sheet HS placed on the dielectric ring 230.

When affixing the heat transfer sheet HS made of, for example, a silicon rubber to the focus ring FR made of a conductive material such as silicon, air bubbles may enter between the heat transfer sheet HS and the focus ring FR. In this case, because the entered air bubbles function as a heat insulating layer that reduces the efficiency of heat transfer between the heat transfer sheet HS and the table 200, it becomes difficult to control the temperature of the focus ring FR. As a result, the temperature of the focus ring FR becomes high during plasma processing, and the plasma processing characteristic varies especially in the peripheral area of the wafer W.

In the present embodiment, to improve the contact between the heat transfer sheet HS and the focus ring FR, three factors, i.e., "load", "vacuum", and "heat", are used when affixing the heat transfer sheet HS to the focus ring FR.

Using the factor "load" in affixing the heat transfer sheet HS to the focus ring FR indicates mechanically pressing the focus ring FR to the heat transfer sheet HS. Also, the focus ring FR may be pressed to the heat transfer sheet HS by using a pressure difference between the vacuum pressure and the atmospheric pressure generated by "vacuum" described later.

The pressing force or the "load" for pressing the focus ring FR to the heat transfer sheet HS is preferably as large as possible to improve the contact between them. However, when the pressing force exceeds 600 kgf, the heat transfer sheet HS may run off the edge of the focus ring FR. For this reason, generally, it is preferable to press the focus ring FR at a pressing force greater than or equal to 300 kgf and less than or equal to 600 kgf.

Using the factor "vacuum" in affixing the heat transfer sheet HS to the focus ring FR indicates reducing the pressure to place the heat transfer sheet HS under a vacuum pressure and thereby removing air bubbles generated when affixing the heat transfer sheet HS.

The degree of vacuum may be set at any value that can be achieved by a vacuum pump such as a turbo-molecular pump used as the evacuation unit 135.

Using the factor "heat" in affixing the heat transfer sheet HS to the focus ring FR indicates increasing the temperature of the heat transfer sheet HS (and the focus ring FR) during a process of affixing the heat transfer sheet HS. Increasing the temperature of the heat transfer sheet HS causes a side chain (sub chain) in a chemical structure of a material such as a silicon resin of the heat transfer sheet HS to be cleaved and eliminated by heat energy. This in turn allows the heat transfer sheet HS to follow the fine undulation of the surface of the focus ring FR and makes it possible to improve the contact between the heat transfer sheet HS and the focus ring FR.

Silicon rubber, which is a material of the heat transfer sheet HS, is a polymer rubber where a backbone is bonded by a siloxane bond (Si—O—Si bond) and a methyl group is generally bonded as a side chain. By heating the silicon rubber to a temperature at which the siloxane bond is not cleaved but at least a part of side chain bonds such as a Si—$CH_3$ bond and/or a $CH_2$—$CH_2$ bond is cleaved, it is possible to improve the gap following property and reduce the thermal resistance of the silicon rubber.

Figure 2:
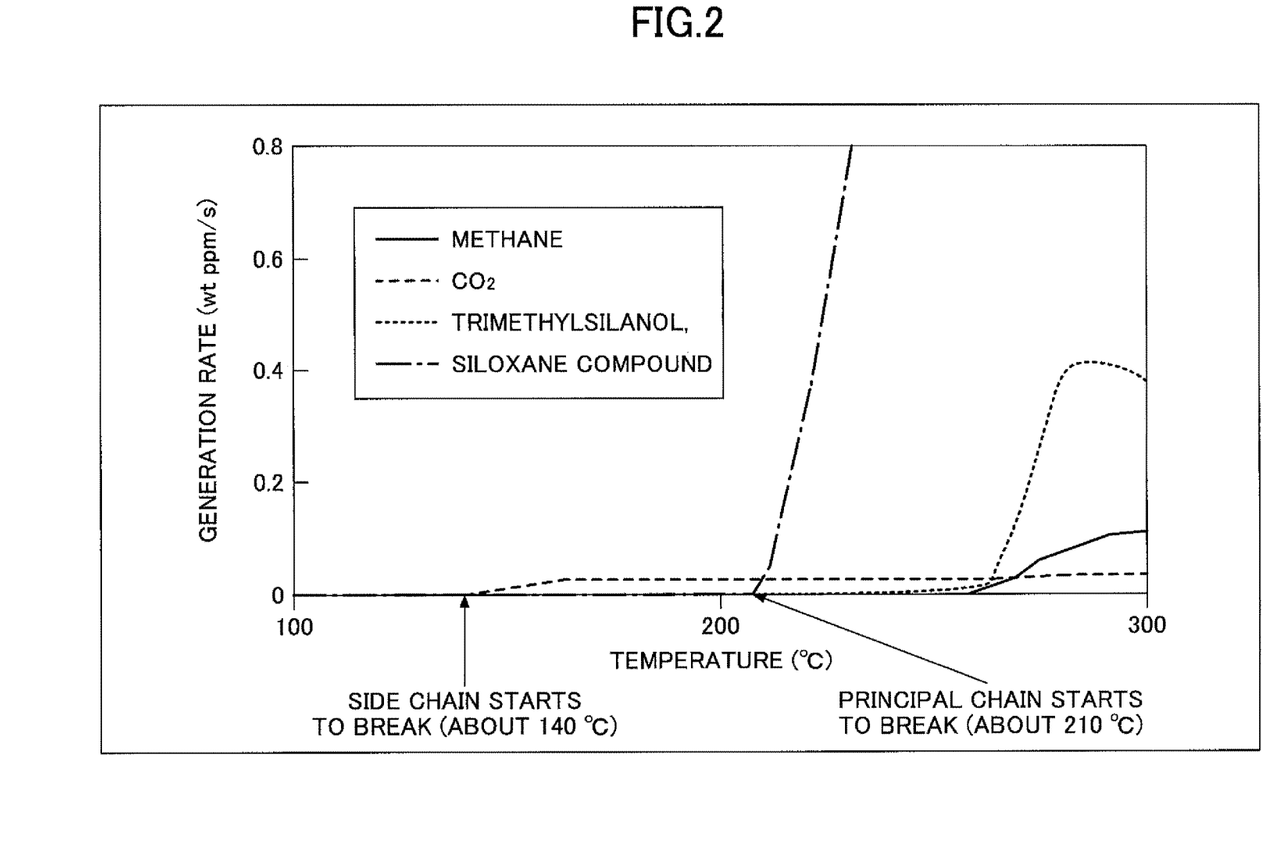
FIG. 2 is a graph illustrating exemplary measurements in a temperature programmed desorption-mass spectrometry performed on a heat transfer sheet of an embodiment.

FIG. 2 is a graph illustrating exemplary measurements in a temperature programmed desorption-mass spectrometry (TPD-MS) performed on a heat transfer sheet of the present embodiment. The temperature programmed desorption-mass spectrometry is a method where the generation rates of gases, which are generated when an analysis target (the heat transfer sheet in this embodiment) is heated, are tracked as functions of time. In FIG. 2, the horizontal axis indicates temperatures and the vertical axis indicates the generation rates of gases at different temperatures. Also in FIG. 2, a solid line indicates a methane gas, a dashed line indicates a carbon dioxide gas, a dotted line indicates trimethylsilanol, and a dashed-dotted line indicates a siloxane compound. A silicon rubber, which includes a backbone bonded by a siloxane bond and a methyl group as a side chain, is used as the heat transfer sheet.

As illustrated by FIG. 2, in the present embodiment, when the silicon rubber is heated from the room temperature, generation of the carbon dioxide gas starts at around 140° C. The generation of the carbon dioxide gas indicates that the side chain in the silicon rubber is cleaved. Also in the present embodiment, generation of the siloxane compound starts at around 210° C. The generation of the siloxane compound indicates that the siloxane bond, i.e., the principal chain, of the siloxane compound is cleaved. Thus, according to the present embodiment, it is preferable to apply "heat" such that the silicon rubber is heated to a temperature greater than or equal to about 140° C. and less than or equal to about 210° C. Applying "heat" to the silicon rubber (heat transfer sheet HS) within this temperature range enables the heat transfer sheet HS to follow the fine undulation of the surface of the focus ring FR and makes it possible to improve the contact between the heat transfer sheet HS and the focus ring FR.

Experiments were performed to confirm the advantage of using "load", "vacuum", and "heat" as in a method of affixing the heat transfer sheet HS of the present embodiment.

Figure 3A:
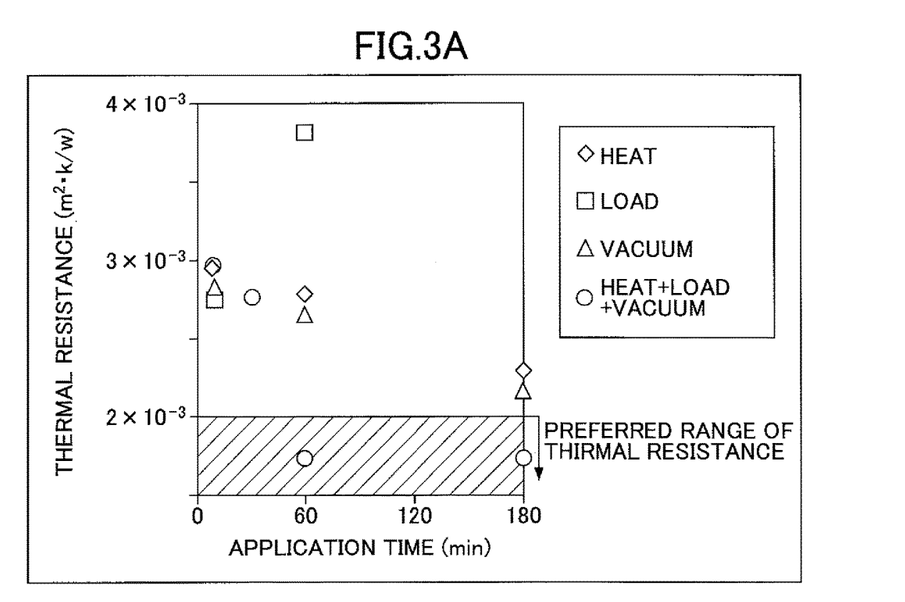
FIGS. 3A and 3B are drawings used to describe relationships between retention time and the thermal resistance of a heat transfer sheet in a method of affixing a heat transfer sheet.
Figure 3B:
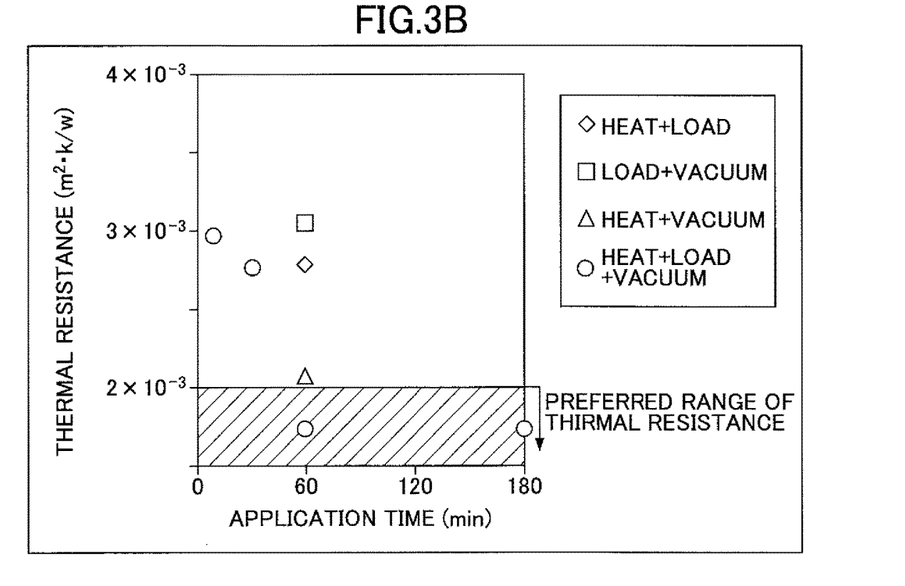

FIG. 3A is a drawing used to describe a relationship between retention time and the thermal resistance of a heat transfer sheet in a method of affixing a heat transfer sheet according to the present embodiment, and FIG. 3B is another drawing used to describe the relationship. More specifically, FIG. 3A and FIG. 3B illustrate relationships between application time and the thermal resistance of the heat transfer sheet HS in experiments where the heat transfer sheet HS was affixed to the focus ring FR while applying one or more of the factors "load", "vacuum", and "heat" to the heat transfer sheet HS. In FIG. 3A and FIG. 3B, the horizontal axis indicates application time for which the factors are applied, and the vertical axis indicates the thermal resistance of the heat transfer sheet at the corresponding application time.

FIG. 3A illustrates the results of an experiment where all of the three factors "load", "vacuum", and "heat" were applied and the results of experiments where one of the three factors "load", "vacuum", and "heat" was applied. In FIG. 3A, a rhombus indicates a result of an experiment where "heat" was applied, a square indicates a result of an experiment where "load" was applied, a triangle indicates a result of an experiment where "vacuum" was applied, and a circle indicates a result of an experiment where all of the three factors "load", "vacuum", and "heat" were applied.

FIG. 3B illustrates the results of an experiment where all of the three factors "load", "vacuum", and "heat" were applied and the results of experiments where two of the three factors "load", "vacuum", and "heat" were applied. In FIG. 3B, a rhombus indicates a result of an experiment where "heat" and "load" were applied, a square indicates a result of an experiment where "load" and "vacuum" were applied, a triangle indicates a result of an experiment where "heat" and "vacuum" were applied, and a circle indicates a result of an experiment where all of the three factors "load", "vacuum", and "heat" were applied.

In the experiments, a layered structure as illustrated by FIG. 1 was formed by stacking a heat transfer sheet made of a silicon rubber, which includes a backbone bonded by a siloxane bond and a side chain of a methyl group, and the focus ring FR on the dielectric ring 230 made of aluminum. Next, a pressing part, which includes a heater and can adjust a pressing force for pressing the focus ring FR, was placed on the focus ring FR. "Load" was applied by the pressing part, "vacuum" was applied by a turbo molecular pump that is an example of the evacuation unit 135 of FIG. 1, and "heat" was applied by the heater. The thermal resistance of the heat transfer sheet was calculated based on measurements of the temperature of the focus ring FR.

The following measurement conditions were used:
"heat": 150° C. (when applied) or ambient temperature (when not applied)
"load": 600 kgf (when applied) or 300 kgf (when not applied)
"vacuum": vacuum pressure (when applied) or atmospheric pressure (when not applied)

When the maintenancibility of the plasma processing apparatus is taken into account, it is preferable to reduce the thermal resistance to a stable range, which is, for example, less than or equal to $2 \times 10^{-3}$ (m²·k/w), within an affixing time (or application time) of 60 minutes. As illustrated by FIG. 3A and FIG. 3B, when all of the three factors "load", "vacuum", and "heat" are applied concurrently at least for a predetermined period of time and the heat transfer sheet HS is kept in this condition for a retention time of 60 minutes or more, the thermal resistance of the heat transfer sheet HS is saturated and reduced to the stable range that is less than or equal to $2 \times 10^{-3}$ (m²·k/w). The stable range of the thermal resistance of a heat transfer sheet may vary depending on the type of the heat transfer sheet used and the configuration of a plasma processing apparatus. However, with an affixing method of the present embodiment where all of the three factors "load", "vacuum", and "heat" are applied, it is possible to reliably reduce the thermal resistance of a heat transfer sheet to the stable range in a short affixing time of less than or equal to 60 minutes.

On the other hand, in the experiments of FIG. 3A where only one of the factors "load", "vacuum", and "heat" was applied, the thermal resistance of the heat transfer sheet could not be reduced to the stable range even after a retention time of 180 minutes.

Also, in the experiments of FIG. 3B where two of the factors "load", "vacuum", and "heat" were applied, the thermal resistance of the heat transfer sheet HS could not be reduced to the stable range even after a retention time of 60 minutes.

As described above, when the maintenancibility of the plasma processing apparatus is taken into account, it is preferable to reduce the thermal resistance to the stable range within an affixing time (or retention time) of 60 minutes. Because the thermal resistance of the heat transfer sheet HS was not reduced to the stable range after a retention time of 60 minutes when two of the factors "load", "vacuum", and "heat" were applied, it is preferable to apply the factors "load", "vacuum", and "heat" concurrently at least for a predetermined period of time to reduce the thermal resistance of the heat transfer sheet HS to the stable range. This method makes it possible to easily control the temperature of the focus ring FR, and thereby makes it possible to improve the reproducibility of the plasma processing characteristic especially in the peripheral area of the wafer W.

<Heat Transfer Sheet Affixing Jig>

A heat transfer sheet affixing jig used to perform a heat transfer sheet affixing method of the present embodiment and an affixing method using the heat transfer sheet affixing jig are described with reference to the accompanying drawings.

First Embodiment

Figure 4:
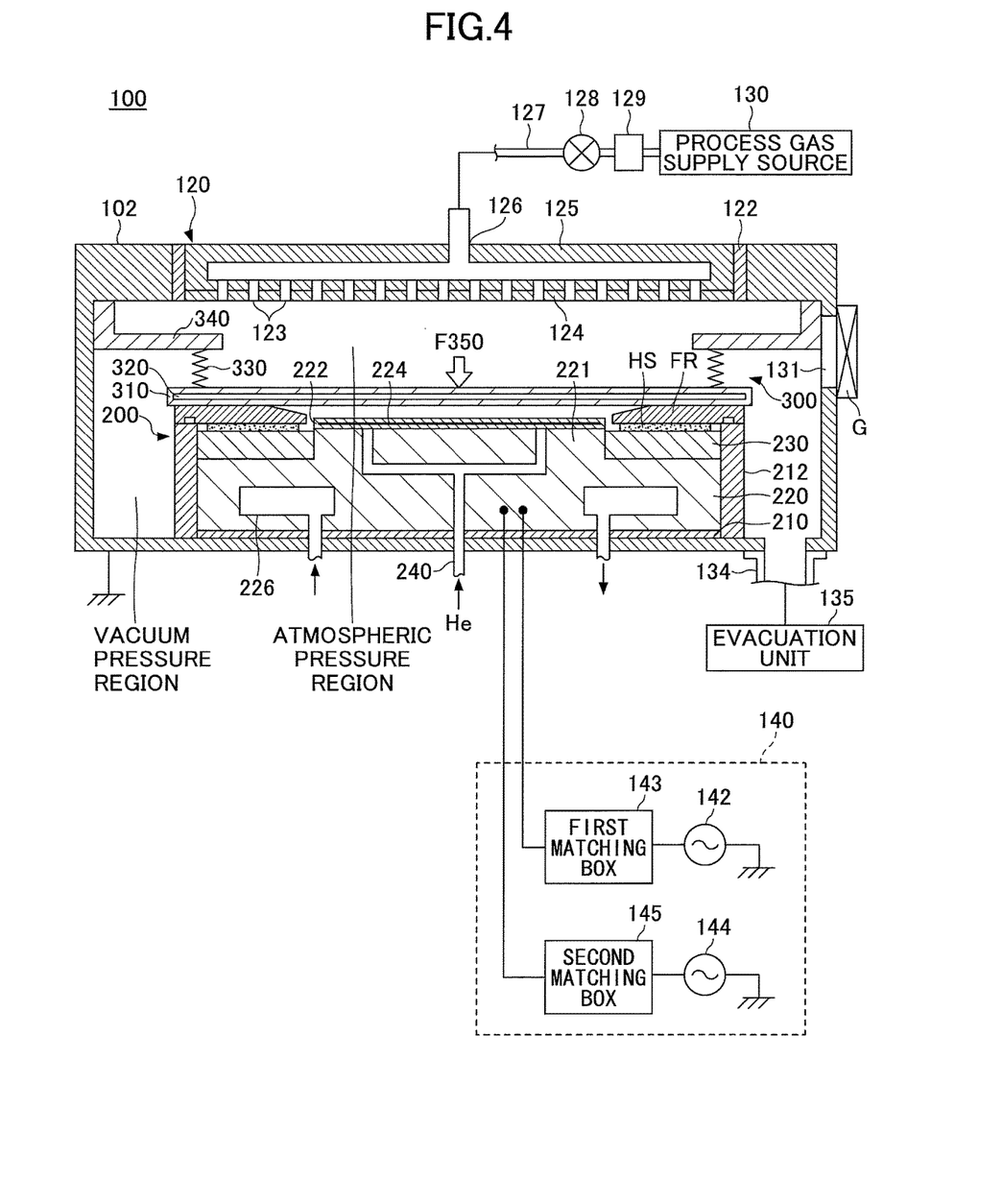
FIG. 4 is a drawing illustrating an exemplary configuration of a heat transfer sheet affixing jig according to an embodiment.

FIG. 4 is a drawing illustrating an exemplary configuration of a heat transfer sheet affixing jig according to the first embodiment.

A heat transfer sheet affixing jig 300 of the first embodiment is disposed on an upper surface (which is not in contact with the heat transfer sheet HS) of the focus ring FR. The heat transfer sheet affixing jig 300 includes a pressing part 310 that presses the focus ring FR to the heat transfer sheet HS by its own weight and a differential pressure described later.

The pressing part 310 is preferably formed to cover the entire surface of the focus ring FR (i.e., on the entire upper surface of the focus ring FR) in plan view seen in a stacking direction in which the focus ring FR and the heat transfer sheet HS are stacked. When the pressing part 310 does not cover the entire surface of the focus ring FR in plan view, the heat transfer sheet HS may not be uniformly affixed to the focus ring FR. For example, the pressing part 310 may be shaped like a disc that is larger than the outer shape of the focus ring FR.

The pressing part 310 includes a heating unit 320 such as a heater. The heating unit 320 generates heat and thereby heats the heat transfer sheet HS via the pressing part 310 and the focus ring FR. In other words, the heating unit 320 can apply "heat" according to the present embodiment to the heat transfer sheet HS.

The pressing part 310 is preferably made of a material such as metal or an alloy having sufficiently high rigidity and a small thermal resistance. A contact surface of the pressing part 310 contacting the focus ring FR may be made of a resin so as not to damage the focus ring FR when a pressing force is applied.

A bellows 330, which is disposed along the circumferential direction of the disc-shaped pressing part 310, is connected to the upper surface (which is opposite to the contact surface contacting the focus ring FR) of the pressing part 310. The bellows 330 can expand and contract in the stacking direction of the focus ring FR and the heat transfer sheet HS according to the displacement of the pressing part 310 in the stacking direction.

The bellows 330 is made of a material such as metal having high rigidity.

The length of the bellows 330 is preferably adjusted such that the pressing part 310 contacts the upper surface of the focus ring FR when the heat transfer sheet affixing jig 300 is installed.

A fixing unit 340 is connected to an end of the bellows 330 that is opposite to the end of the bellows 330 connected to the pressing part 310. The fixing unit 340 fixes the heat transfer sheet affixing jig 300 to the plasma processing apparatus 100.

The fixing unit 340 may be fixed at any position in the plasma processing apparatus 100 where the fixing unit 340 can fix the heat transfer sheet affixing jig 300 to the plasma processing apparatus 100. In view of the rigidity, however, the fixing unit 340 is preferably fixed to a part, such as a side wall or an upper wall, of the chamber 102.

The horizontal position of the pressing part 310 with respect to the focus ring FR can be easily adjusted by fixing the heat transfer sheet affixing jig 300 via the fixing unit 340 to the chamber 102.

Figure 5:
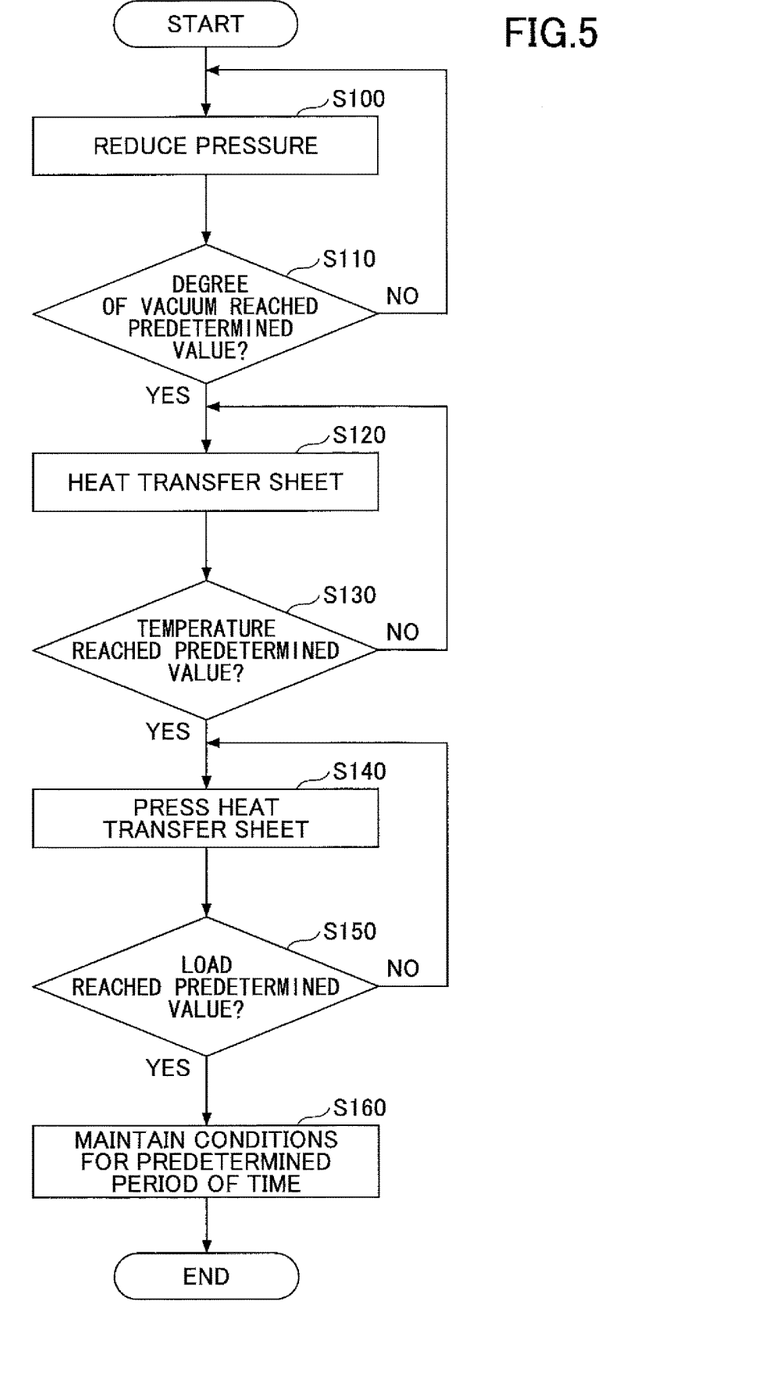
FIG. 5 is a flow chart illustrating a method of affixing a heat transfer sheet according to an embodiment.

A heat transfer sheet affixing method of a preferred embodiment using the heat transfer sheet affixing jig 300 of FIG. 4 is described with reference to FIG. 5. FIG. 5 is a flow chart illustrating a heat transfer sheet affixing method according to the present embodiment.

As described above, "load", "vacuum", and "heat" are used in the heat transfer sheet affixing method of the present embodiment. More specifically, the heat transfer sheet affixing method of the present embodiment includes a step (i) of reducing the pressure to place a heat transfer sheet in a reduced pressure atmosphere (S100), a step (ii) of heating the heat transfer sheet (S120), and a step (iii) of pressing a focus ring to the heat transfer sheet by a pressing part (S140). The pressure reducing step, the heating step, and the pressing step are performed concurrently at least for a predetermined period of time. That is, a condition where all of "vacuum", "heat", and "load" are applied is maintained for a predetermined period of time (S160). Using "vacuum", "heat", and "load" in an affixing process makes it possible to improve the contact between the heat transfer sheet HS and the focus ring FR, and achieve a high thermal transfer efficiency between the table 200 and the focus ring FR.

Respective steps are described below in more detail.
[Pressure Reducing Step (S100)]

In a heat transfer sheet affixing apparatus of FIG. 4, the step (i) of reducing the pressure to place a heat transfer sheet in a reduced pressure atmosphere is performed by the evacuation unit 135 that is implemented, for example, by a turbo molecular pump. The evacuation unit 135 evacuates the chamber 102 to place the heat transfer sheet HS in a reduced pressure atmosphere and thereby remove air bubbles generated when the heat transfer sheet HS is affixed.

The pressure reducing step S100 is performed until the heat transfer sheet is exposed to an atmosphere of a predetermined degree of vacuum (S110). "Vacuum" may be applied by gradually decreasing the pressure from the atmospheric pressure to a predetermined vacuum pressure, or applied by decreasing the pressure at once.

The heat transfer sheet affixing jig 300 of the first embodiment includes the bellows 330 disposed along the circumferential direction of the pressing part 310. This configuration makes it possible to separately control the pressures in inner and outer space inside and outside of the bellows 330 disposed along the circumferential direction of the pressing part 310. More specifically, it is possible to reduce only the pressure in the outer space, which is outside of the bellows 330 and contains the heat transfer sheet HS, to a vacuum pressure by evacuating the outer space with the evacuation unit 135. In this case, the inner space inside of the bellows 330 (i.e., a space containing a part of the surface of the pressing part 310 that is opposite to the contact surface contacting the focus ring FR and inside of the bellows 330) may be maintained at the atmospheric pressure.

When the outer space outside of the bellows 330 and containing the heat transfer sheet HS is set at a vacuum pressure and the inner space inside of the bellows 330 is set at the atmospheric pressure, a pressure difference is generated between the contact surface of the pressing part 310 contacting the focus ring FR and the surface of the pressing part 310 that is opposite to the contact surface and inside of the bellows 330. This pressure difference causes the pressing part 310 to press the focus ring FR to the heat transfer sheet HS.

More specifically, the pressure difference applies a pressing force to the pressing part 310 in a direction indicated by an arrow F350 in FIG. 4, and the pressing force causes the pressing part 310 to move downward in the vertical direction. The bellows 330 expands as the pressing part 310 moves downward in the vertical direction. As a result, the pressing part 310 presses the entire surface of the focus ring FR downward in the vertical direction, and the focus ring FR is pressed against the heat transfer sheet HS.

Also, the pressing part 310 is bent in the direction F350 by the pressure difference. This configuration makes it possible to press the focus ring FR from the inner circumference toward the outer circumference to the heat transfer sheet HS. This in turn makes it possible to reduce air bubbles generated during an affixing process, and also makes it possible to extrude the air bubbles generated during the affixing process from the outer side of the focus ring FR. Thus, the above configuration makes it possible to reliably remove air bubbles generated when the heat transfer sheet HS is affixed to the focus ring FR.

As described above, the heat transfer sheet affixing jig 300 of the first embodiment can apply "vacuum" and "load" at the same time using a pressure difference between a vacuum pressure and the atmospheric pressure. That is, the heat transfer sheet affixing jig 300 can perform the step (i) of reducing the pressure to place a heat transfer sheet in a reduced pressure atmosphere (application of "vacuum") and the step (iii) of pressing a focus ring to the heat transfer sheet by a pressing part (application of "load") at the same time.

The degree of "load" can be adjusted by changing the position where the bellows 330 is placed. For example, when the degree of vacuum in the outer space outside of the bellows 330 is sufficiently high and the inner space inside of the bellows 330 is at the atmospheric pressure, a load of about 600 kgf can be applied to the heat transfer sheet HS by placing the bellows 330 at ϕ272 mm from the center of the focus ring FR.
[Heating Step (S120)]

In the first embodiment, the step (ii) of heating a heat transfer sheet (application of "heat") can be performed by heating the heat transfer sheet HS by the heating unit 320. The heating unit 320 generates heat and thereby heats the heat transfer sheet HS via the pressing part 310 and the focus ring FR. Instead of the heating unit 320 of the first embodiment, any other device or method may be used to heat the heat transfer sheet HS.

As a result of the heating step S120, the heat transfer sheet is heated to a predetermined temperature (S130). As described above, the heat transfer sheet is heated, for example, to a temperature that is greater than or equal to a temperature at which a side chain of the transfer sheet is cleaved and less than a temperature at which a principal chain of the heat transfer sheet is cleaved. The heating rate in the heating step is not limited to a specific value and can be set at any appropriate value.

[Pressing Step (S140)]

In the first embodiment, as described above, the pressure reducing step also serves as the pressing step, and "vacuum" and "load" can be applied at the same time. However, when a predetermined load cannot be generated by the pressure difference, a pressing force adjusting unit (not shown) for adjusting the pressing force may be used to generate an additional load.

The pressing force is increased until a predetermined load is applied to the heat transfer sheet HS (S150). The load application rate in applying the load is not limited to a specific value and can be set at any appropriate value.

[Retention (S160)]

After the predetermined degree of vacuum, the predetermined temperature, and the predetermined load are achieved at steps S110, S130, and S150, this condition is maintained for a predetermined period of time.

In the flowchart of FIG. 5, "vacuum", "heat", and "load" are applied in this order. However, the present invention is not limited to this example, and "vacuum", "heat", and "load" may be applied in any other order. In other words, steps S100 (and S110), S120 (and S130), and S140 (and S150) may be performed in any order. The contact between a heat transfer sheet and a focus ring can be improved by keeping the heat transfer sheet in a condition where "vacuum", "heat", and "load" are applied concurrently at least for a predetermined period of time (e.g., 60 minutes).

As described above, the heat transfer sheet affixing jig 300 of the first embodiment is configured to affix the heat transfer sheet HS using "load", "vacuum", and "heat". This configuration makes it possible to affix a heat transfer sheet to a focus ring while improving the contact between the heat transfer sheet and the focus ring, and thereby makes it possible to achieve a high thermal transfer efficiency between a table and the focus ring. Also, with the heat transfer sheet affixing jig 300 of the first embodiment, it is possible to efficiently apply "vacuum" and "load" at the same time by using a pressure difference between the atmospheric pressure and a vacuum pressure generated in the step of applying "vacuum".

Second Embodiment

Figure 6:
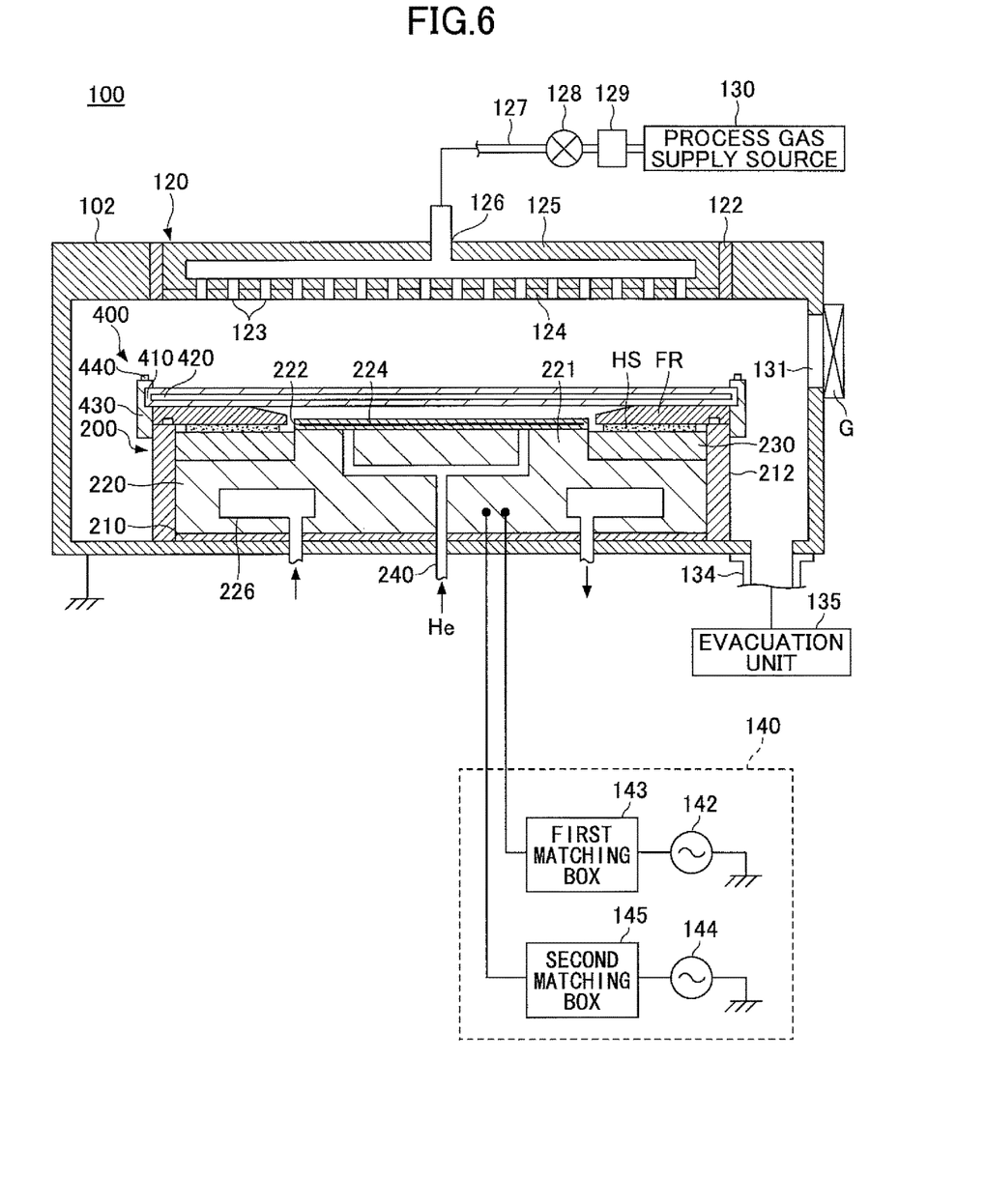
FIG. 6 is a drawing illustrating another exemplary configuration of a heat transfer sheet affixing jig according to an embodiment.

FIG. 6 is a drawing illustrating another exemplary configuration of a heat transfer sheet affixing jig according to a second embodiment.

A heat transfer sheet affixing jig 400 of the second embodiment is disposed on an upper surface of the focus ring FR, and includes a pressing part 410 that presses the focus ring FR to the heat transfer sheet HS.

The pressing part 410 is provided on the entire upper surface of the ring-shaped focus ring FR and may be shaped like a disc. The pressing part 410 includes a heating unit 420 such as a heater. The heating unit 420 generates heat and thereby heats the heat transfer sheet HS via the pressing part 410 and the focus ring FR.

The material of the pressing part 410 may be substantially the same as the material of the pressing part 310 of the first embodiment.

The heat transfer sheet affixing jig 400 includes a fixing unit 430. The pressing part 410 is fixed by the fixing unit 430 to, for example, a table 200.

The heat transfer sheet affixing jig 400 also includes a pressing force adjusting unit 440 for adjusting the pressing force of the pressing part 410. With the heat transfer sheet affixing jig 400 of the second embodiment, the step (iii) of pressing a focus ring to a heat transfer sheet can be performed by adjusting the pressing force by the pressing force adjusting unit 440.

The pressing force adjusting unit 440 may be implemented, for example, by a screw. "Load" can be applied to the heat transfer sheet HS at a predetermined pressing force by adjusting the amount by which the screw is driven into the fixing unit 430. That is, in the second embodiment, "load" is applied by a mechanical pressure applied by the pressing part 410 to the focus ring FR.

In the second embodiment, the step (ii) of heating a heat transfer sheet (application of "heat") can be performed by the heating unit 420 in a manner similar to the first embodiment. The heating unit 420 generates heat and thereby heats the heat transfer sheet HS via the pressing part 410 and the focus ring FR.

In the second embodiment, the step (i) of reducing the pressure to place a heat transfer sheet in a reduced pressure atmosphere is performed, for example, by reducing the pressure in the entire chamber 102 with the evacuation unit 135.

Thus, the second embodiment is different from the first embodiment in that the pressure in the entire system is reduced to a vacuum pressure. In the second embodiment, different from the first embodiment where "vacuum" and "load" are applied at the same time using a pressure difference, "load" is applied by a mechanical pressure applied by the pressing part 410 to the focus ring FR.

Similarly to the first embodiment, the heat transfer sheet affixing jig 400 of the second embodiment is also configured to affix the heat transfer sheet HS using "load", "vacuum", and "heat". Using "load", "vacuum", and "heat" concurrently at least for a predetermined period of time makes it possible to affix a heat transfer sheet to a focus ring while improving the contact between the heat transfer sheet and the focus ring, and thereby makes it possible to achieve a high thermal transfer efficiency between a table and the focus ring.

An aspect of this disclosure provides a method of affixing a heat transfer sheet that can achieve high heat transfer efficiency between a table and a focus ring.

A heat transfer sheet affixing method and a heat transfer sheet affixing jig according to embodiments of the present invention are described above. However, the present invention is not limited to the specifically disclosed embodiments, and variations and modifications may be made without departing from the scope of the present invention.

For example, the present invention may be implemented as a system including a plasma processing apparatus and an affixing device (heat transfer sheet affixing jig) disposed in the plasma processing apparatus. The plasma processing apparatus may include a controller for controlling components of the plasma processing apparatus and the affixing device to perform a heat transfer sheet affixing method of the above embodiment.

What is claimed is:

1. A heat transfer sheet affixing method where a focus ring is pressed by a pressing part to a heat transfer sheet placed on a heat transfer sheet mounting part of a plasma processing apparatus to affix the heat transfer sheet to the focus ring, the method comprising:

reducing a pressure to place the heat transfer sheet in a reduced-pressure atmosphere;

heating the heat transfer sheet by a heating unit; and pressing the focus ring by the pressing part to the heat transfer sheet, said pressing part including the heating unit, wherein the heat transfer sheet is heated by the heating unit via the pressing part and the focus ring, wherein the reducing, the heating, and the pressing are performed concurrently at least for a predetermined period of time, wherein the pressing part has a disc-like shape;

in the pressing, an opposite surface of the pressing part, which is opposite to a contact surface of the pressing part contacting the focus ring, is pressed via an extendable bellows disposed along a circumferential direction of the pressing part to press the focus ring to the heat transfer sheet, said extendable bellows being arranged along a periphery of the pressing part, wherein the method further comprises a controlling pressure inside of the extendable bellows and a pressure outside of the extendable bellows and pressing the focus ring against the heat transfer sheet by a pressure difference between the controlling pressure inside and the outside pressure of the extendable bellows in addition to the focus ring's own weight, wherein the extendable bellows is connected to an exhaust part and the extendable bellows is configured to have a vacuum state between the extendable bellows and the exhaust part, wherein a pressure that the focus ring applies to the heat transfer sheet is adjusted by changing a position of the bellows, wherein the heat transfer sheet is a polymer rubber in which a backbone is bonded by a siloxane bond and a methyl group is bonded as a side chain, wherein said heating step heats the heat transfer sheet at such a temperature that the siloxane bond is not cut and the side chain is at least partially cut, and wherein the heat transfer sheet affixing method is performed when a maintenance of the plasma processing apparatus is performed.

2. The heat transfer sheet affixing method as claimed in claim 1, wherein the bellows is connected to the pressing part having the disc-like shape at a desired position in a radial direction of the pressing part so that the focus ring is pressed to the heat transfer sheet at a desired pressure.

3. The heat transfer sheet affixing method as claimed in claim 1, wherein the pressing part is bent by the pressure difference in a stacking direction in which the focus ring and the heat transfer sheet are stacked so that the focus ring is pressed by the pressing part to the heat transfer sheet from an inner circumference of the focus ring toward an outer circumference of the focus ring.

4. The heat transfer sheet affixing method as claimed in claim 1, wherein the heat transfer sheet has a ring-like shape disposed to surround a wafer to be processed by the plasma processing apparatus; and the focus ring covers the heat transfer sheet so that the heat transfer sheet is not exposed to plasma during plasma processing performed by the plasma processing apparatus.

5. The heat transfer sheet affixing method as claimed in claim 1, wherein the pressing part completely overlaps the focus ring, and wherein the bellows is arranged to press the pressing part.

6. The heat transfer sheet affixing method as claimed in claim 1, wherein a dielectric ring is provided between a table and the heat transfer sheet.

7. The heat transfer sheet affixing method as claimed in claim 1, wherein a conductive ring is provided between a table and the heat transfer sheet.

8. The heat transfer sheet affixing method as claimed in claim 1, wherein the heating unit is provided inside of the pressing part.

9. The heat transfer sheet affixing method as claimed in claim 1, wherein the controlling step controls only the pressure outside of the extendable bellows to be the vacuum state so that air bubbles that are inadvertently formed by installation of the heat transfer sheet are removed toward an outer periphery of the focus ring.

* * * * *